United States Patent [19]

Hochreutiner et al.

[11] Patent Number: 4,575,642

[45] Date of Patent: Mar. 11, 1986

[54] CONTROL CIRCUIT FOR AN INTEGRATED DEVICE

[75] Inventors: Roger M. Hochreutiner, Lieli, Switzerland; Walter Mattheus, Kessel-Lo, Belgium

[73] Assignee: International Standard Electric Corporation, New York, N.Y.

[21] Appl. No.: 567,850

[22] PCT Filed: Apr. 7, 1983

[86] PCT No.: PCT/CH83/00042

§ 371 Date: Dec. 7, 1983

§ 102(e) Date: Dec. 7, 1983

[87] PCT Pub. No.: WO83/03724

PCT Pub. Date: Oct. 27, 1983

[30] Foreign Application Priority Data

Apr. 7, 1982 [CH] Switzerland .......................... 2153/82

[51] Int. Cl.$^4$ ............................................. H03K 17/08
[52] U.S. Cl. ................... 307/200 A; 307/246; 307/270; 307/259; 307/585
[58] Field of Search ............. 179/18 F, 18 A, 18 GF; 307/200 A, 200 B, 351-353, 544, 243, 257, 259, 246, 570, 572, 577, 579, 264, 584-585, 270, 317 R, 321; 328/26

[56] References Cited

U.S. PATENT DOCUMENTS

| 3,564,387 | 2/1971 | Gadberry | 328/26 X |
| 3,777,181 | 12/1973 | Bancroft | 307/321 X |
| 4,156,153 | 5/1979 | Szechenyi | 179/18 GF X |
| 4,170,740 | 10/1979 | Pernyeszi | 307/584 |
| 4,443,719 | 4/1984 | Planer et al. | 307/570 |
| 4,487,458 | 12/1984 | Janutka | 307/577 |
| 4,488,058 | 12/1984 | Cheffer | 307/584 X |

FOREIGN PATENT DOCUMENTS

| 2348414 | 8/1975 | Fed. Rep. of Germany | 179/18 GF |
| 0130286 | 10/1980 | Japan | 179/18 GF |

OTHER PUBLICATIONS

Siebel, "Peripheral Devices for the Unimat 4080 PABX", *Electrical Communication*, vol. 55, No. 1, 1980 pp. 57-62 (179/18ES).

*Primary Examiner*—Stanley D. Miller
*Assistant Examiner*—D. R. Hudspeth
*Attorney, Agent, or Firm*—John T. O'Halloran; Jeffrey P. Morris

[57] ABSTRACT

In order to have with an integratable solid state relay a galvanic isolation between the control and the switch similar to that of a mechanical relay the control is performed via DC/DC-converters in a classical voltage-doubler circuit configuration. The switch function is provided by a pair of complementary MOS-transistors (Tr$_1$ and Tr$_2$) the gate/source capacitances (C$_{gs}$) of which are used as charging capacitances of the DC/DC-converters. In order to have a perfect blocking of the MOS-switches two DC/DC-converters (C$_1$,C$_2$,D$_1$,D$_2$,C$_{gs}$; C$_3$,C$_2$,D$_3$,D$_5$,C$_{gs}$) are provided which are controlled by two signals in the phase opposition so that for both switching states the same noise margin capability and the same switching-over times result. The circuit arrangement includes only diodes, MOS-transistors and capacitances (C$_1$,C$_2$,C$_3$) of very small value which can be integrated without any difficulties.

9 Claims, 7 Drawing Figures

CONTROL CIRCUIT FOR AN INTEGRATED DEVICE

The present invention relates to a control circuit for an integrated device as set forth in the preamble of claim 1 and its application in a solid state relay.

For high voltage solid state relays with a high voltage switch on an integrated circuit there must be provided a galvanic isolation between the electronic switching paths and the control input of the relay. It is known to perform said galvanic isolation with the aid of opto-couplers or transformers. But neither opto-couplers nor transformers can be integrated in known MOS-technique on a single chip together with the high voltage part of the relay.

A galvanic isolation between the high voltage switch and the control input of the solid state relay is very important for a fully integrated circuit because the high voltage of the switch may damage the control portion of the relay or may at least result in an unintentional switching of the relay. The galvanic isolation between the control input and the output of the relay is desired or even required for many applications, e.g. for subscriber line circuits in telephony wherein the switch portion of the relay should be free of ground potential.

From U.S. Pat. No. 4,170,740 there is known an integratable solid state relay having galvanically isolated inputs and outputs. The galvanic isolation is performed by capacitors between a control circuit including a DC/DC-converter and a drive circuit with an EXCLUSIVE-OR gate being responsive to control signals in phase opposition only and by the gate capacitances of the MOS-transistors in the switch circuit between the load circuit and the logic circuit. This relay can be integrated without any problems, but its noise margin capability in its off-condition is very poor. This is caused by the fact that the complementary MOS-transistors in the switch are correctly brought into the conducting condition by a positive bias, that however the change into their blocked condition is performed only by dropping this bias. This results in different time constants for switching on and off and in a high impedance state-off condition so that there is a possibility that the gate capacitances are charged by spurious voltages from the load or the control circuits leading to an unintentional switching.

It is therefore an object of the present invention to provide a circuit arrangement for an integratable solid state relay which avoids the above mentioned drawbacks and which provides the same noise margin capability in both switching conditions.

This object is achieved by the invention as set forth in the characterizing part of claim 1. Preferred embodiments are set forth in the depending claims.

The invention will be best understood from the following description of embodiments taken in conjunction with the accompanying drawing in which.

As in the above mentioned patent also in the present solid state relay there are used capacitances for the galvanic isolation. The control is performed via DC/DC-converters and the load switches are MOS-transistors with double diffusion, i.e. DMOS-transistors with a high break-through voltage of about 400 V as it is needed for a wide application of the solid state relay. The technique of the double diffusion for achieving high break-through voltages was described by Dr. Plumer, Standford University in *IEEE Journal Solid State Circuits,* vol. SC-11, Dec. 1976, pages 809-817.

Figure 1:
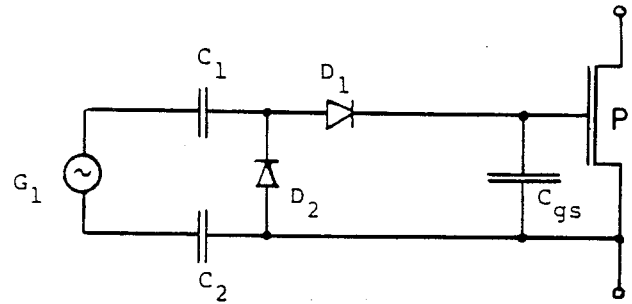
FIG. 1-3 show circuit diagrams of asymmetrical MOS-switches to explain the mode of operation of switches of this kind.

The DC/DC-converter as shown in FIG. 1 is a classical capacitively coupled voltage doubler with an AC-generator $G_1$, capacitors $C_1$ and $C_2$, diodes $D_1$ and $D_2$ and a charging capacitor $C_{gs}$ which is shown as a separate capacitor, but which is in fact the gate/source capacitance of a DMOS-transistor $Tr_1$ working as a switching transistor. With this circuit it is possible to charge the capacitance $C_{gs}$ to twice the peak value of the generator voltage minus the voltage drops accross the diodes $D_1$ and $D_2$.

An outstanding feature of each conventional electromechanical relay is its high noise immunity. A solid state relay has to fulfill this requirement too. In order to achieve this the MOS-switch should have a low input impedance which could be realized e.g. by a resistor between the gate and the source electrodes, but this resistor would compromise a low energy high voltage drive for the on-state.

Figure 2:
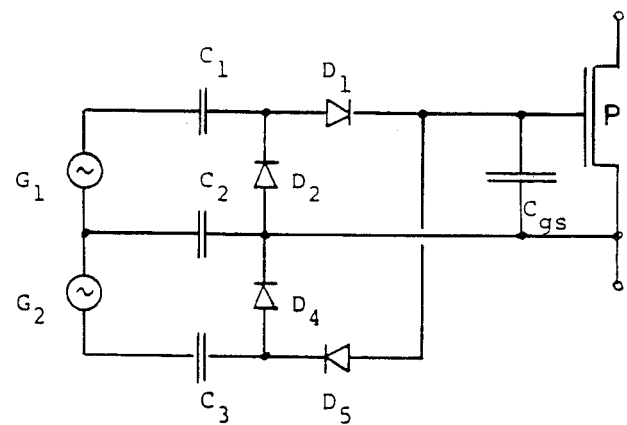

In order to avoid this problem it is mandatory to reversely bias DMOS-transistor $Tr_1$, i.e. to charge the capacitance $C_{gs}$ from a low impedance source with a charge of opposite polarity. To this aim in FIG. 2 there is provided a second DC/DC-converter with a second AC-generator $G_2$, a capacitor $C_3$ and diodes $D_4$ and $D_5$ which converter delivers a voltage having a polarity opposite to that of the first DC/DC-converter. In this circuit however the diodes of one converter short-circuit the output of the other one so that the maximum voltage across $C_{gs}$ is limited to only $\pm 1.5$ V, i.e. to the voltage drops over the respective series connected diodes.

In order to avoid this limitation two complementary MOS-transistors P and N are provided in the leads to the charging capacitance $C_{gs}$ branching-off the respective disturbing DC/DC-converter.

It can be shown that the noise immunity of this circuit is outstanding. If the unused branch of the DC/DC-converter is high impedance a positive noise spike at the source of the MOS transistor $Tr_1$ cannot alter the charge across $C_{gs}$. If the charge on $C_{gs}$ has the positive sign on the gate of $Tr_1$ a current flows through the two upper coupling capacitors $C_1$ and $C_2$. A negative noise spike will pull current out of the coupling capacitors through $C_{gs}$ and tend to charge $C_{gs}$ even more positively which is acceptable. A zener diode, not shown, protects this circuit against over-voltage. In this form the circuit will withstand the maximum technology voltage of $\pm 400$ V. The only limit will be defined by the power dissipation due to the fact that the impedance of the coupling capacitors falls with frequency.

Figure 3:
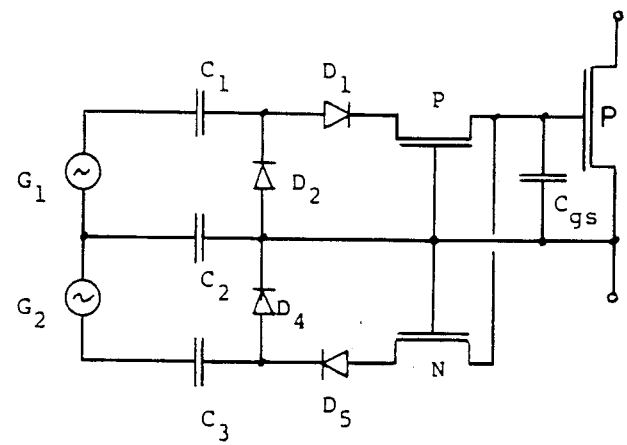
Figure 4:
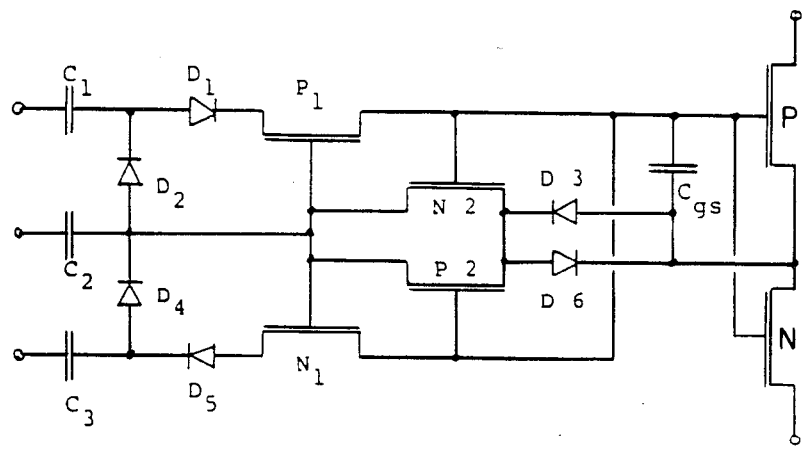
FIG. 4 shows a circuit diagram of a symmetrical MOS-switch in its simplest form.

In an actual application of the circuit according to FIG. 3 the source of the MOS-transistor $Tr_1$ will be connected e.g. to a subscriber line which in turn will be connected to ground via some complex capacitive or resistive networks. This can short-circuit the central coupling capacitor and therefore limit drastically the output voltage of the DC/DC-converters. In order to avoid this an additional diode per polarity of converter is called for in the central line of the circuit according to FIG. 3 which must be switched depending on the required voltage polarity. The circuit will then be as shown in FIG. 4 with the additional elements $D_3$, $D_6$ and $N_2$, $P_2$ compared with the circuit according to FIG. 3. Additionally the circuit as shown in FIG. 4 is provided in its switch portion with a pair of complementary MOS-transistors $Tr_1$ and $Tr_2$ instead of the single MOS-transistor $Tr_1$ in order to be able to switch AC-signals.

It was stated above that a correct operation in a noise environment is achieved when the unused drive branch is high impedance. Should this not be the case for a positive charge on $C_{gs}$ a noise spike would drive the MOS-transistor $N_1$ in conduction and alter the charge of $C_{gs}$.

It appeared that for a practical realisation of the circuit it is easier to drive the central and bottom branches together in anti-phase to the top one for one of the switch conditions (e.g. MOS switch on) and the two top branches together in anti-phase to the bottom one for the other switch condition. This is implemented in the circuit as shown in FIG. 5.

Figure 5:
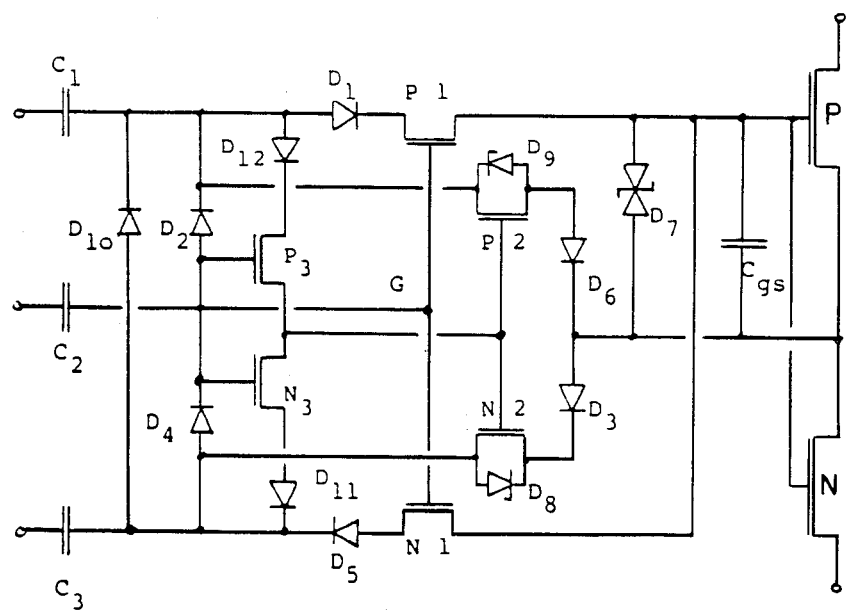
FIG. 5 shows a circuit diagram of the drive circuit of an integratable solid state relay according to the invention.

In the circuit according to FIG. 5 the elements $D_2$, $D_4$, $P_3$ and $N_3$, $D_{11}$ and $D_{12}$ form an auxilary power supply charging the capacitances of gates $P_2$ and $N_2$ (node G) during each half period. This charge remains dynamically fixed until the control conditions are changed. The top converter consists now of the elements $D_1$, $P_1$, $D_3$, $N_2$, $D_{10}$ and the bottom converter of the elements $P_2$, $D_6$, $N_1$, $D_5$, and $D_{10}$. The diode $D_{10}$ ensures a more efficient recharging of the capacitances $C_1$ and $C_3$ by bypassing the diodes $D_2$ and $D_4$. It can be seen that the biasing of $P_2$ and $N_2$ is largely independent of the voltage across $C_{gs}$ due to the impedance of $P_1$ (and $N_1$) during the charging process of $C_{gs}$. An initial zero-volt potential across $C_{gs}$ will not reduce this biasing. It will also be noted that no time constants are used. When the drive changes e.g. from $C_1 = \overline{C}_2 = \overline{C}_3$ to $C_3 = \overline{C}_2 = \overline{C}_1$ the auxilary supply will change equally rapidly for both of the switching polarities.

The switch-over will be extremely fast. Lets take the case of $C_{gs}$ being charged positively. As soon as $C_1 = \overline{C}_2 = \overline{C}_3$ changes to $C_3 = \overline{C}_2 = \overline{C}_1$ the polarity at node G switches over and $P_3$, $N_2$ are off, whereas $P_2$, $N_3$ are on. Capacitance $C_{gs}$ will be discharged during the negative half-cycle at $C_3$ via $N_1$, $D_5$, $D_{10}$, $P_2$, $D_6$ with a peak initial current of 6 mA (8 V/3 didoes+1 kΩ) so that the discharging from 8 V down to 2.25 V (3 diodes) has not to be pumped out by the pumping circuit. Thanks to the node G control all charging paths are unambiguous insuring a fast switching over.

Following is an analysis of the noise capability of this circuit. Depending on the polarity of the charge at $C_{gs}$ and on the polarity of the noise signal the following cases can occur:

(a) $C_{gs}$ is charged positively with regard to the source of the switch, the MOS-switch being on. $P_3$ and $P_1$ are on for every positive half-wave of the drive at $C_1$. The gates at node G ($P_2$, $N_2$) are charged positively, $P_2$ being off and $N_2$ being on.

(aa) Noise voltage positive: The noise current flows via $D_3$, $N_2$, $C_3$ and then also via $D_{10}$, $C_1$ and $D_4$, $C_2$. When the voltage across $N_2$ exceeds 10 V the zener diode $D_8$ conducts insuring that the sum of the voltages across $N_2$ and $C_{gs}$ does not exceed the break-through voltage of $N_1$. The charge of $C_{gs}$ does not alter. The peak value of the noise current is largely defined by the impedance of all coupling capacitors in parallel and is about 72 mA with a noise voltage of 400 V at 1 MHz.

(ab) Noise voltage negative: All elements remains as above. Current flows via $C_1$, $D_1$, $P_1$ to $C_{gs}$. The charge of $C_{gs}$ is limited through a zener diode $D_7$. When the sum of the voltages across $P_1$ and $C_{gs}$ exceeds a value of 10 V the zener diode $D_9$ conducts and takes any excess current. Here also current flows through the capacitors $C_2$ and $C_3$ in parallel to $C_1$. The charge of $C_{gs}$ does not alter. The current has also a maximum value of 72 mA with 400 V at 1 MHz.

In both conditions the noise current falls linearly with frequency. If the charge of node G falls to zero, e.g. during a very long noise burst, all elements connected to G will be off in both conditions, but the charge of $C_{gs}$ will not be altered, obviously the alteration due to the normal leakage current being excepted, and all noise current flows through zener diodes.

(b) $C_{gs}$ is charged negatively, the MOS-switch being off. $N_3$ is on at every negative half-wave of drive voltage at $C_3$. The gate node G is negative, $P_3$ and $N_2$ being off, $P_2$ being on.

(ba) Noise voltage positive: The noise current flows via $C_{gs}/D_7$, $N_1$, $D_5$ and at higher currents than 2 mA via $D_3$ and $D_8$ and all coupling capacitors in parallel.

(bb) Noise voltage negative: The noise current flows via $P_2$, $D_6$ and at higher currents than 2 mA via $D_9$ and $D_6$.

In both cases the charge of $C_{gs}$ remains unchanged.

Some indications concerning the circuit design of the drive circuit according to FIG. 5 will follow. The gate capacitance $C_{gs}$ is, as already mentioned, no separate element and has a value of about 100 pF. This calls for coupling capacitances of about 10–15 pF for $C_1$ and $C_3$ which are the only ones which pump current into the gate capacitance $C_{gs}$. Capacitance $C_2$ can be as small as 1 pF as it has to charge only the capacitances of the auxiliary gates of $P_3$ and $N_3$ as well as $P_1$ and $N_1$, each having a value of about ¼ pF.

The zener diodes $D_8$, $D_9$, and $D_7$ have to have zener voltages the sum of which is smaller than the break-through voltages of $N_1$ or $P_1$, respectively, i.e. about 18 V. A distribution of 8 V for $D_7$ and 9 V for each of the diodes $D_8$ and $D_9$ is a possible solution. In any case the voltages of $D_8$ and $D_9$ must be larger that that of $D_7$. With very high noise spikes the P and N diffusions will be forward biased so that the noise current will flow into ground or to the power line depending on its polarity.

The resistance of all the elements in their on-condition is of secondary importance. All diodes and metal lines need however at least a 100 mA capability when they are located in the noise current path.

Figure 6:
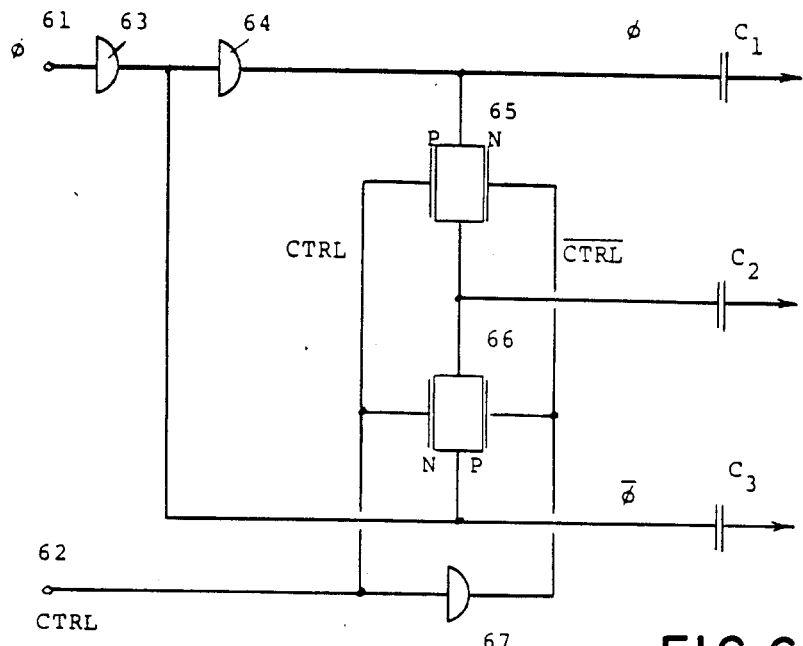
FIG. 6 shows a circuit diagram of the control circuit of the relay according to FIG. 5.

FIG. 6 shows the control circuit belonging to the drive circuit of FIG. 5. It consists mainly of two cascaded inverting power amplifiers 63 and 64 being able to deliver the needed pumping currents and of a pair of transmission gates 65 and 66 having complementary channels. To an input 61 there is applied an oscillator signal having a frequency of e.g. 1 MHz and an amplitude of 5 $V_{pp}$ whereas to an input 62 a DC-signal is applied to control via an inverting gate 67 the switching condition of the MOS-switches at the output of the drive circuit according to FIG. 5.

Figure 7:
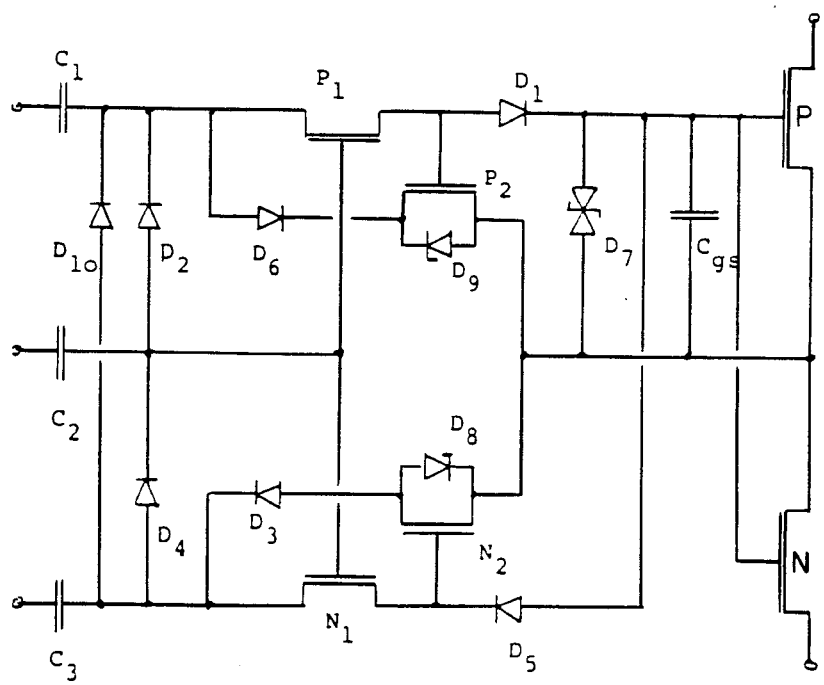
FIG. 7 shows a circuit diagram of a simplified version of the drive circuit of a solid state relay.

FIG. 7 shows a simplified version of the circuit according to FIG. 5. The auxiliary supply with transistors $P_3$ and $N_3$ has been removed and the node G was connected to the gate of the MOS-switch. Thanks to its greater simplicity the stray capacitances of the integrated circuit are smaller giving an equal if not better performance as the circuit as shown in FIG. 5, expressed in switching times.

Noise voltage spikes occurring at the source of the MOS-switch have the same effect as in the previous arrangement, i.e. they have practically no effect on the charge of the gate/source capacitance $C_{gs}$ of the MOS-switch and therefore they do not affect the switch status.

The substrates of the different MOS-transistors are connected to their respective sources, e.g. in FIG. 5 to the left hand terminals of the transistors $P_1$, $P_2$, $N_1$ and $N_2$, respectively. Due to the diodes connected in series with these transistors a safe operation of these elements is guaranteed. The diodes $D_1$ and $D_5$ are arranged at the right of the transistors $P_1$ and $N_1$, respectively so that these transistors can be driven harder and thus can cut off the transistors $P_2$ and $N_2$, respectively, more effectively.

The present circuit arrangement can be used as shown in the drawing in conjunction with an integrated high voltage switch but can also drive any other separate high input impedance element. The available signal is $\pm 8$ V in 100 pF with a rise time of 10 μs. The admissible voltage is $\pm 400$ V and the noise capability is better than 1000 V/μs.

What is claimed is:

1. Monolithically integrated control circuit for an integrated device with galvanic isolation between its input and its output including a push-pull AC-source connected via two series input capacitances ($C_1$, $C_3$) to the input of a rectifying circuit incorporating at least four diodes, and a shunt output charging capacitance ($C_{gs}$) being coupled across the output of said rectifying circuit and isolated from said input capacitances, characterized in that a third series input capacitance ($C_2$) is provided having its input connected to said push-pull AC-source and having its output also connected to the input of said rectifying circuit which produces first and second output polarities respectively, and control means to charge the output capacitance ($C_{gs}$) with said first or with said second output polarity produced by said rectifying circuit.

2. Control circuit according to claim 1, characterized in that the control means comprise gate means (65, 66) to connect the input of the third series capacitance ($C_2$) selectively with the input of the first ($C_1$) or of the second ($C_3$) series capacitances in order to charge the output capacitance ($C_{gs}$) with the first or the second polarity with an equal and substantially negligible time delay.

3. Control circuit according to claim 2, characterized in that the source/drain paths of a first pair of complementary MOS transistors ($P_1$, $N_1$) are connected in series with diodes ($D_1$, $D_5$) of the rectifying circuit in order to connect the first ($C_1$) and the second ($C_3$) series capacitances with the output capacitance, the gate electrodes of said transistors being coupled to the third series capacitance ($C_2$).

4. Control circuit according to claim 3, characterized in that into the branch with the third series capacitance there are inserted two oppositely poled diodes ($D_3$, $D_6$) each connected in series with one MOS-transistor of a second pair of complementary MOS-transistors ($P_2$, $N_2$) which are controlled by the potential across the output capacitance ($C_{gs}$) in order to avoid an excessive load of the control circuit by elements in the load circuit of the integrated device.

5. Control circuit according to claim 4, characterized in that each of the switching paths of the second MOS-transistors ($P_2$, $N_2$) is protected by a zener diode ($D_9$, $D_8$) and the output capacitance ($C_{gs}$) is protected by a limiting diode ($D_7$) or two zener diodes connected in series and oppositely poled against over-voltage.

6. Control circuit according to claim 5, characterized in that the sum of the zener voltage of one of the zener diodes ($D_8$ or $D_9$, respectively) and the voltage of the limiting diode ($D_7$) is smaller than the breakthrough voltage of the first MOS-transistors ($P_1$, $N_1$) in order to protect their switching paths against over-voltage.

7. Control circuit according to claim 6, characterized in that a third pair of complementary MOS-transistors ($P_3$, $N_3$) is provided to charge the gate/source capacitance of the second pair of MOS-transistors ($P_2$, $N_2$) during each half-period.

8. Control circuit according to claim 1 in a solid state relay, characterized in that the integrated device consists of a pair of complementary MOS-power-transistors ($Tr_1$, $Tr_2$), and that the output capacitance consists of the gate/source capacitance of said transistors.

9. Control circuit according to claim 8, characterized in that the MOS-power-transistors are integrated on the substrate of the control circuit.

* * * * *